United States Patent
Lee et al.

(10) Patent No.: US 9,612,274 B2
(45) Date of Patent: Apr. 4, 2017

(54) PROBE CARD AND TEST APPARATUS INCLUDING THE SAME

(71) Applicant: Samsung Electronics Co., Ltd., Suwon-Si, Gyeonggi-Do (KR)

(72) Inventors: Jun-Hee Lee, Hwaseong-si (KR); Jong-Hyun Kim, Suwon-Si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 165 days.

(21) Appl. No.: 14/187,541

(22) Filed: Feb. 24, 2014

(65) Prior Publication Data

US 2014/0239992 A1     Aug. 28, 2014

(30) Foreign Application Priority Data

Feb. 25, 2013  (KR) .......................... 10-2013-0019628

(51) Int. Cl.
    *G01R 31/28*     (2006.01)
(52) U.S. Cl.
    CPC ..... *G01R 31/2817* (2013.01); *G01R 31/2805* (2013.01)
(58) Field of Classification Search
    CPC .............................. H01L 23/34; G01R 31/287
    See application file for complete search history.

(56) References Cited

U.S. PATENT DOCUMENTS

| 7,048,610 B1 * | 5/2006 | Tregub .................... B24B 37/20 |
| | | 323/280 |
| 7,285,968 B2 * | 10/2007 | Eldridge ............ G01R 31/2863 |
| | | 324/750.03 |
| 7,667,474 B2 | 2/2010 | Sunohara et al. |
| | (Continued) | |

FOREIGN PATENT DOCUMENTS

| JP | 2008-103528 A | 5/2008 |
| JP | 2008-298749 A | 12/2008 |
| | (Continued) | |

OTHER PUBLICATIONS

Tabik, Siham et al., "Mapping Parallel Loops on Multicore Systems," Conference Report, 2012.

*Primary Examiner* — Jermele M Hollington
*Assistant Examiner* — Feba Pothen
(74) *Attorney, Agent, or Firm* — Harness, Dickey & Pierce, P.L.C.

(57) ABSTRACT

A probe card including a multi-layered substrate, a plurality of needles, and a temperature controlling unit may be provided. The multi-layered substrate may include a test pattern through which a test current passes. The needles may be provided on the multi-layered substrate. The needles may be electrically connected to the test pattern and may be configured to contact an object so that the test current may be supplied to the object. The temperature controlling unit may provide the multi-layered substrate with at least one of a first temperature and a second temperature, the first temperature being higher than the second temperature. Thus, a time for setting a test temperature may be shortened. As a result, thermal deformation of the probe card and/or the object may be reduced or suppressed, and thus reliability of test result may be improved.

13 Claims, 4 Drawing Sheets

(56) References Cited

U.S. PATENT DOCUMENTS

| | | | |
|---|---|---|---|
| 2007/0018664 A1* | 1/2007 | Bae | G01R 31/2891 |
| | | | 324/750.11 |
| 2007/0268029 A1* | 11/2007 | McClanahan | G01R 1/44 |
| | | | 324/750.09 |
| 2010/0156449 A1 | 6/2010 | Nitta et al. | |
| 2010/0164520 A1 | 7/2010 | Kiyofuji et al. | |
| 2010/0327891 A1 | 12/2010 | Hobbs | |

FOREIGN PATENT DOCUMENTS

| | | |
|---|---|---|
| JP | 2009-204384 A | 9/2009 |
| JP | 2010-243352 A | 10/2010 |
| KR | 10-0967339 B1 | 7/2010 |

\* cited by examiner

PROBE CARD AND TEST APPARATUS INCLUDING THE SAME

CROSS-RELATED APPLICATION

This application claims priority under 35 USC §119 to Korean Patent Application No. 2013-19628, filed on Feb. 25, 2013 in the Korean Intellectual Property Office (KIPO), the contents of which are herein incorporated by reference in their entirety.

BACKGROUND

1. Field

Example embodiments relate to probe cards and/or test apparatuses including the same. More particularly, example embodiments relate to probe cards including needles configured to electrically make contact with a semiconductor substrate, and/or test apparatuses including the probe card.

2. Description of the Related Art

Generally, a probe card may be used for testing a semiconductor substrate. The probe card may include a multi-layered substrate having a test pattern, and a plurality of needles provided to the multi-layered substrate to make contact with the semiconductor substrate. A test current generated from a tester may be transmitted to the semiconductor substrate through the test pattern and the needles to test electrical characteristics of the semiconductor substrate. The semiconductor substrate may be tested at a high temperature and a low temperature. Thus, the high temperature and the low temperature may be selectively provided to a test chamber in which the semiconductor substrate may be placed.

According to related arts, times for providing the test chamber with the high temperature and/or the low temperature may be long. Further, the high temperature and the low temperature may be repeatedly provided to the semiconductor substrate and the probe card, thereby thermally deforming the semiconductor substrate and/or the probe card. This may cause the needles of the probe card to not accurately make contact with a pad of the semiconductor substrate. Furthermore, the needles may cause damages to the semiconductor substrate to be tested.

SUMMARY

At least one example embodiment provides probe cards capable of providing a high temperature and a low temperature in a relatively short time, and/or maintaining a desired temperature without a pre-heating time and/or a pre-cooling time.

At least one example embodiment also provides test apparatuses including the above-mentioned probe card.

In one example embodiment, a probe card includes a multi-layered substrate, a plurality of needles and a temperature controlling unit. The multi-layered substrate may include a test pattern through which a test current may pass. The needles may be provided to the multi-layered substrate. The needles may be electrically connected to the test pattern and to be connected to an object to supply the test current to the object. The temperature controlling unit may provide the multi-layered substrate with at least one of a first temperature and a second temperature, the first temperature being higher than the second temperature.

The temperature controlling unit may include at least one of a heating member configured to provide the multi-layered substrate with the high temperature, and a cooling member configured to provide the multi-layered substrate with the low temperature.

The heating member may include a heating block built in the multi-layered substrate, and a heating coil built in the heating block.

The heating block and the multi-layered substrate may have substantially same diameters.

The heating block and the multi-layered substrate may include a substantially same material.

The cooling member may include a cooling block built in the multi-layered substrate. The cooling block may include a cooling passageway through which a cooling fluid may pass.

The cooling fluid may include a cooling gas, a cooling liquid, etc.

The cooling block and the multi-layered substrate may have substantially same diameters.

The cooling block and the multi-layered substrate may include a substantially same material.

The temperature controlling unit may include a thermoelectric module.

The thermoelectric module may be arranged on a first surface of the multi-layered substrate, the first surface being opposite to a second surface facing a test object.

The probe card may further include a stiffener configured to support the multi-layered substrate, and a printed circuit board (PCB) interposed between the stiffener and the multi-layered substrate.

The temperature controlling unit may include a thermoelectric module attached to the stiffener.

In another example embodiment, an apparatus for testing an object includes a tester, a test head, and a probe card. The tester may be configured to generate a test current for testing the object. The test head may be configured to be electrically connected to the tester. The probe card may be electrically connected to the test head. The probe card may include a multi-layered substrate, a plurality of needles, and a temperature controlling unit. The multi-layered substrate may include a test pattern through which the test current may pass. The needles may be electrically connected to the test pattern and may be configured to be electrically connected to the object to supply the test current to the object. The temperature controlling unit may be configured to provide the multi-layered substrate with at least one of a first temperature and a second temperature, the first temperature being higher than the second temperature.

In still another example embodiment, a probe card includes a substrate including a test pattern, which is configured to pass a test current therethrough, a plurality of needles on the substrate and electrically connected to the test pattern, and a temperature controlling unit configured to control a temperature of the substrate.

The substrate may be a multi-layered substrate sequentially stacking insulating layers.

The temperature controlling unit may be configured to control the temperature of the substrate by using Peltier effect.

The temperature controlling unit may include first and second heating plates running in parallel, a heat absorbing plate facing both the first heating plate and the second heating plate, an N-type semiconductor device between the first heating plate and the heat absorbing plate, a P type semiconductor device between the second heating plate and the heat absorbing plate, and a power supply electrically connecting the first heating plate to the second heating plate.

A closed loop for current flow may be formed by the power supply, the first heating plate, the N-type semiconductor device, the heat absorbing plate, the P type semiconductor device, and the second heating plate.

According to example embodiments, the temperature controlling unit may rapidly heat or cool the multi-layered substrate such that a temperature of the probe card reach a desired high or low temperature in a relatively short time. Thus, a time for setting a test temperature may be shortened. As a result, thermal deformation of the probe card and/or the object may be reduced or suppressed, thereby improving reliability of test results.

BRIEF DESCRIPTION OF THE DRAWINGS

Example embodiments will be more clearly understood from the following detailed description taken in conjunction with the accompanying drawings. FIGS. 1 to 7 represent non-limiting, example embodiments as described herein.

DETAILED DESCRIPTION

Various example embodiments will be described more fully hereinafter with reference to the accompanying drawings, in which some example embodiments are shown. Example embodiments may, however, be embodied in many different forms and should not be construed as limited to the example embodiments set forth herein. Rather, these example embodiments are provided so that this disclosure will be thorough and complete, and will fully convey the scope of example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Probe Card

Figure 1:
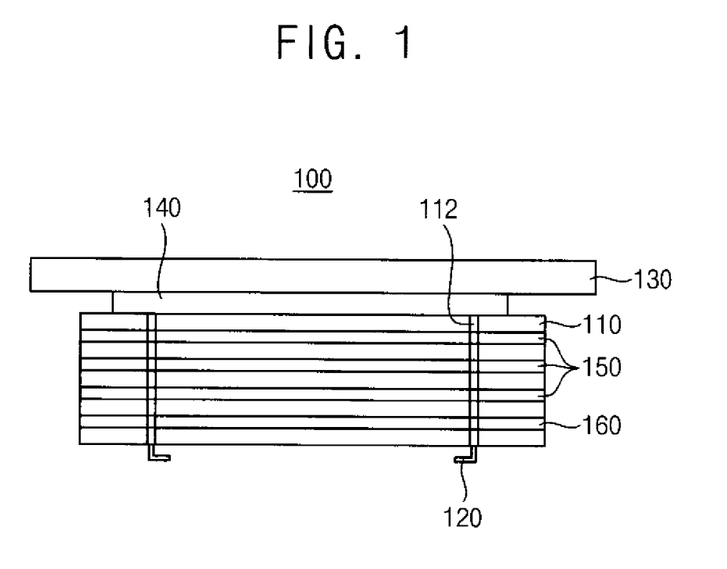
FIG. 1 is a cross-sectional view illustrating a probe card in accordance with an example embodiment.
Figure 2:
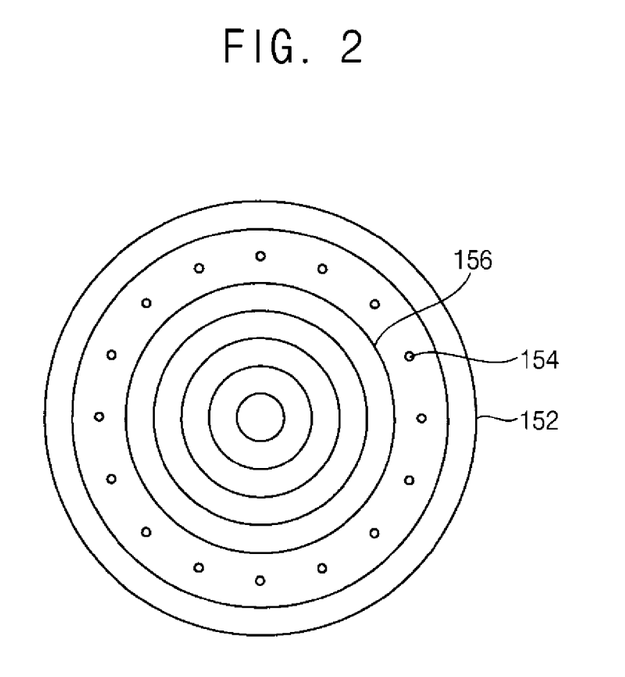
FIG. 2 is a plan view illustrating a heating member of the probe card in FIG. 1.
Figure 3:
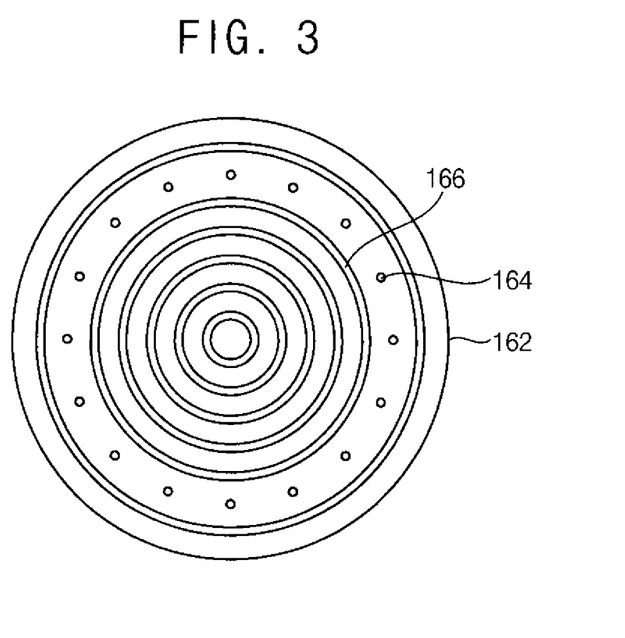
FIG. 3 is a plan view illustrating a cooling member of the probe card in FIG. 1.

FIG. 1 is a cross-sectional view illustrating a probe card in accordance with an example embodiment, FIG. 2 is a plan view illustrating a heating member of the probe card in FIG. 1, and FIG. 3 is a plan view illustrating a cooling member of the probe card in FIG. 1.

Referring to FIG. 1, a probe card 100 of this example embodiment may include a multi-layered substrate 110, a plurality of needles 120, a stiffener 130, a printed circuit board (PCB) 140, and a temperature controlling unit.

The multi-layered substrate 110 may include sequentially stacked insulating substrates. For example, the insulating substrates may include ceramic substrates. Test patterns 112 may be built in the multi-layered substrate 110. A test current for testing an object may pass through the test patterns 112. The object may include a semiconductor substrate.

The needles 120 may be arranged on a lower surface of the multi-layered substrate 110. The needles 120 may be electrically connected to the test patterns 112. The needles 120 may electrically contact terminals of the object. Thus, the test current may be supplied to the object through the test patterns 112 and the needles 120.

The stiffener 130 may be arranged over the multi-layered substrate 110. The stiffener 130 may be configured to support the multi-layered substrate 110.

The PCB 140 may be interposed between the stiffener 130 and the multi-layered substrate 110. The PCB 140 may have a test circuit (not shown) through which the test current may pass. Therefore, the test circuit may be electrically connected to the test patterns 112.

The temperature controlling unit may selectively provide the multi-layered substrate 110 with a high temperature and a low temperature. For example, to test the object at the high temperature, the temperature controlling unit may provide the multi-layered substrate 110 with the high temperature. In contrast, to test the object at the low temperature, the temperature controlling unit may provide the multi-layered substrate 110 with a low temperature. For example, the temperature controlling unit may include a heating member 150 and a cooling member 160.

The heating member 150 may be arranged between the insulating substrates of the multi-layered substrate 110. The heating member 150 may directly contact the multi-layered substrate 110 to conductively heat the multi-layered substrate 110. Although the heating member 150 of this example embodiment includes three members, the heating member 150 may include one member, two members or at least four members. The number of the heating member 150 may vary in accordance with a magnitude of the high temperature.

Referring to FIG. 2, the heating member 150 may include a heating block 152 and a heating coil 156. The heating block 152 may be interposed between the insulating substrates of the multi-layered substrate 110. For example, the heating block 152 may directly contact the multi-layered substrate 110. The heating block 152 may have a plurality of holes 154 through which the test patterns 112 may pass. The heating coil 156 may be built in the heating block 152. Accordingly, the heat generated from the heating coil 156 may be conductively transferred to the multi-layered substrate 110 through the heating block 152.

Although the heating block 152 of this example embodiment has a diameter substantially the same as that of the multi-layered substrate 110, the heating block 152 may have a diameter longer or shorter than that of the multi-layered substrate 110. Further, the heating block 152 may include a material substantially the same as that of the multi-layered substrate 110. For example, the heating block 152 may include ceramic.

Referring to FIG. 3, the cooling member 160 may include a cooling block 162. The cooling block 162 may be interposed between the insulating substrates of the multi-layered substrate 110. For example, the cooling block 162 may directly contact with the multi-layered substrate 110. The cooling block 162 may have a plurality of holes 164 through which the test patterns 112 may pass. Further, the cooling block 162 may have a cooling passageway 166 through which a cooling fluid may pass. Accordingly, the low temperature of the cooling fluid flowing through the cooling passageway 166 may be conductively transferred to the multi-layered substrate 110 through the cooling block 162. For example, the cooling fluid may include a cooling gas, a cooling liquid, etc.

According to these example embodiments, the temperature controlling unit may heat or cool the multi-layered substrate such that a temperature of the probe card reaches a desired high or low temperature in a relatively short time. Thus, a time for setting a test temperature may be substantially shortened. As a result, thermal deformation of the probe card and/or the object may be reduced or suppressed, and thus reliability of test results may be improved.

Figure 4:
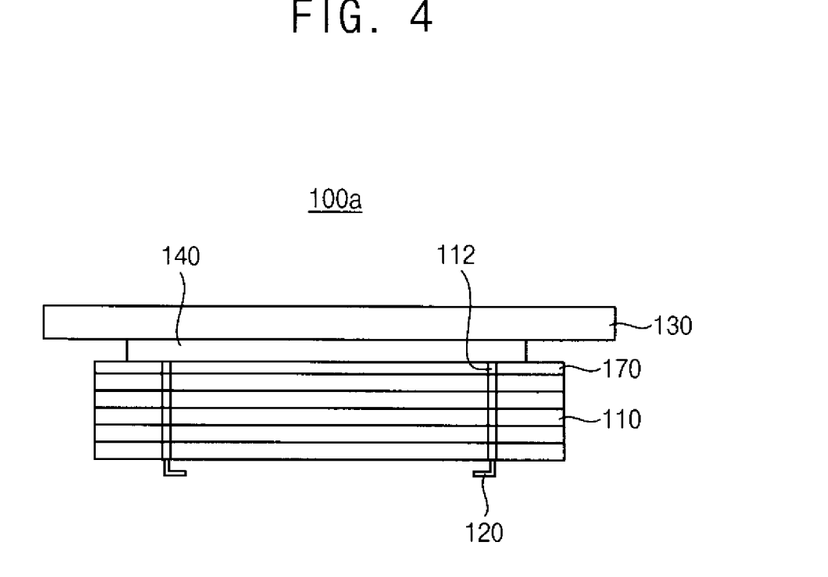
FIG. 4 is a cross-sectional view illustrating a probe card in accordance with another example embodiment.
Figure 5:
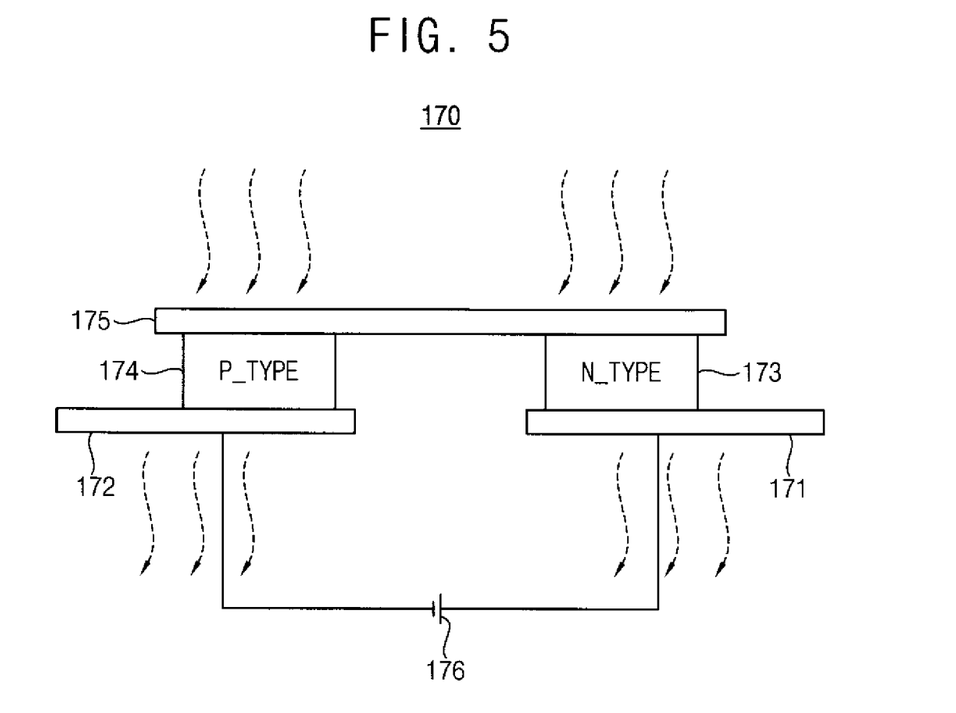
FIG. 5 is a cross-sectional view illustrating a thermoelectric module of the probe card in FIG. 4.

FIG. 4 is a cross-sectional view illustrating a probe card in accordance with another example embodiment, and FIG. 5 is a cross-sectional view illustrating a thermoelectric module of the probe card in FIG. 4.

A probe card 100a of this example embodiment may include elements substantially the same as those of the probe card 100 in FIG. 1 except for a temperature controlling unit. Thus, the same reference numerals may refer to the same elements and any further illustrations with respect to the same elements may be omitted herein for brevity.

Referring to FIG. 4, the probe card 100a may include a thermoelectric module 170 as the temperature controlling unit. The thermoelectric module 170 may be arranged on an upper surface of the multi-layered substrate 110.

Referring to FIG. 5, the thermoelectric module 170 may include first and second heat-emitting plates 171 and 172, a heat-absorbing plate 175 opposite to the first and second heat-emitting plates 171 and 172, and N type and P type semiconductor devices 173 and 174 interposed between the heat-absorbing plate 175 and the first and second heat-emitting plates 171 and 172. A power supply 176 may be electrically connected to the first and second heat-emitting plates 171 and 172.

A current may be provided to the first heat-emitting plate 171 from the power supply 176. The current may flow to the second heat-emitting plate 172 through the N type semiconductor device 173, the heat-absorbing plate 175, and the P type semiconductor device 174. Thus, the first and second heat-emitting plates 171 and 172 may emit heat. The heat-absorbing plate 175 may absorb heat. In contrast, when a current may be provided to the second heat-emitting plate 172 from the power supply 176, the current may flow to the first heat-emitting plate 171 through the P type semiconductor device 174, the heat-absorbing plate 175, and the N type semiconductor device 173. Thus, the first and second heat-emitting plates 171 and 172 may absorb heat. The heat-absorbing plate 175 may emit heat. This may be due to the well-known Peltier effect.

The Peltier effect may be explained as a principle that an ideal gas may be cooled by a constant entropy expansion. When an electron may move from a semiconductor having a higher electron concentration to a semiconductor having a lower electron concentration, an electron gas may expand and may work with respect to a potential barrier between two plates having a substantially similar chemical potential, thereby electrically cooling an object.

Figure 6:
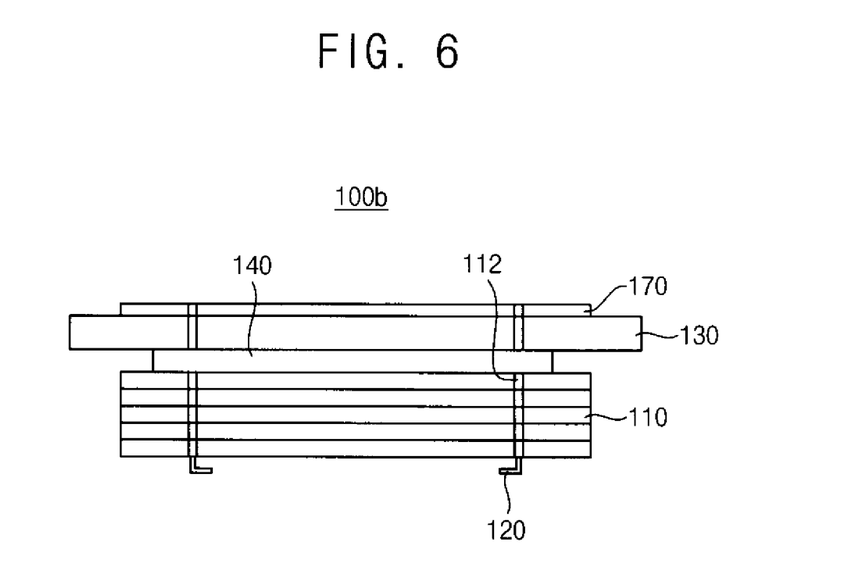
FIG. 6 is a cross-sectional view illustrating a probe card in accordance with still another example embodiment.

FIG. 6 is a cross-sectional view illustrating a probe card in accordance with still another example embodiment.

A probe card 100b of this example embodiment may include elements substantially the same as those of the probe card 100*a* in FIG. 4 except for a position of the temperature controlling unit. Thus, the same reference numerals may refer to the same elements and any further illustrations with respect to the same elements may be omitted herein for brevity.

Referring to FIG. 6, the thermoelectric module 170 may be arranged on an upper surface of the stiffener 130. Thus, the thermoelectric module 170 may selectively provide the multi-layered substrate 110 with the high temperature or the low temperature through the stiffener 130 and the PCB 140.

Test Apparatus

Figure 7:
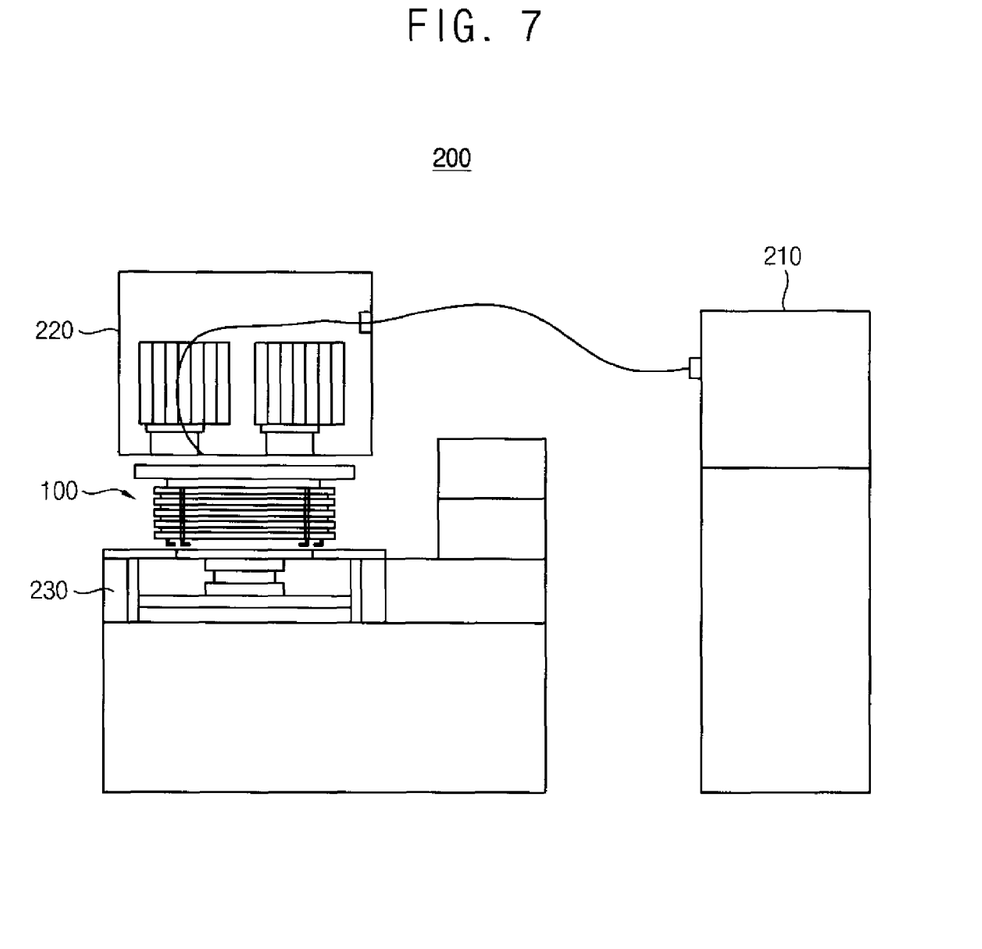
FIG. 7 is a cross-sectional view illustrating a test apparatus including the probe card in FIG. 1.

FIG. 7 is a cross-sectional view illustrating a test apparatus including the probe card in FIG. 1.

Referring to FIG. 7, a test apparatus 200 in accordance with this example embodiment may include a tester 210, a test head 220, a probe card 100, and a stage unit 230.

The tester 210 may generate a test current for testing the object. The test head 220 may electrically connect the tester 210 with the probe card 100 to transmit the test current to the probe card 100. The stage unit 230 may be configured to support the object.

A probe card 100 of this example embodiment may include elements substantially the same as those of the probe card 100 in FIG. 1. Thus, the same reference numerals may refer to the same elements and any further illustrations with respect to the same elements may be omitted herein for brevity. The apparatus 200 may include the probe card 100*a* in FIG. 4 or the probe card 100*b* in FIG. 6.

To test the object at the high temperature, a controller (not shown) may operate the heating member 150. Thus, the heat generated from the heating coil 156 may be conductively transferred to the multi-layered substrate 110 through the heating block 152 to provide the multi-layered substrate 110 with the high temperature.

In contrast, to test the object at the low temperature, the controller may operate the cooling member 160. Thus, the low temperature of the cooling fluid supplied through the cooling passageway 166 may be conductively transferred to the multi-layered substrate 110 through the cooling block 162 to provide the multi-layered substrate 110 with the low temperature.

According to this example embodiment, the controller may operate the heating member 150 or the cooling member 160 to reach desired high or low test temperatures, in a relatively short time. Thus, times for setting the test temperatures may be shortened. Because the temperature of the probe card 100 may be uniformly maintained by the heating member 150 or the cooling member 160, thermal deformation of the probe card 100 may be reduced or suppressed.

According to example embodiments, the temperature controlling unit may heat or cool the multi-layered substrate such that a temperature of the probe card reach a desired high or low temperature in a relatively short time. Thus, a time for setting a test temperature may be greatly shortened. As a result, thermal deformation of the probe card and/or the object may be reduced or suppressed, thereby improving reliability of the test results.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A probe card comprising:
a multi-layer substrate structure including a plurality of insulating substrates, the plurality of insulating substrates including a first insulating substrate, a second insulating substrate, a third insulating substrate, and a fourth insulating substrate;
a printed circuit board (PCB) on a first surface of the multi-layer substrate structure, the PCB including a test circuit;
a stiffener on the PCB;
a first temperature controlling unit between the first insulating substrate and the second insulating substrate;
a second temperature controlling unit between the third insulating substrate and the fourth insulating substrate, the second temperature controlling unit including a block and a passageway, and the block including a plurality of holes, the passageway configured to flow fluid therethrough;
a plurality of test patterns passing through the multi-layer substrate structure and the first temperature controlling unit, the plurality of test patterns configured to be electrically connected to the test circuit, the plurality of test patterns passing through the plurality of holes included in the block; and
a plurality of needles on a second surface of the multi-layer substrate structure, the plurality of needles electrically connected to the plurality of test patterns.

2. The probe card of claim 1, wherein the plurality of test patterns are configured to pass test current therethrough.

3. The probe card of claim 1, wherein the second insulating substrate and the third insulating substrate are a same insulating substrate.

4. The probe card of claim 1, further comprising:
a third temperature controlling unit between the second insulating substrate and a third insulating substrate.

5. The probe card of claim 1, wherein the first temperature controlling unit is a heating member.

6. The probe card of claim 1, wherein the second temperature controlling unit is a cooling member.

7. The probe card of claim 1, wherein the second temperature controlling unit is between the PCB and the multi-layer substrate structure.

8. The probe card of claim 1, wherein the second temperature controlling unit is on the stiffener.

9. The probe card of claim 1, wherein
the first temperature controlling unit includes a block and a coil, and
the block includes a plurality of holes through which the plurality of test patterns pass.

10. A probe card comprising:
a multi-layer substrate structure including a plurality of insulating substrates, the plurality of insulating substrates including a first insulating substrate, a second insulating substrate, a third insulating substrate and a fourth insulating substrate;

a printed circuit board (PCB) on a first surface of the multi-layer substrate structure, the PCB including a test circuit;

a stiffener on the PCB;

a heating temperature controlling unit between the first insulating substrate and the second insulating substrate, the heating temperature controlling unit including a first block and a coil;

a cooling temperature controlling unit between the third insulating substrate and the fourth insulating substrate, the cooling temperature controlling unit including a second block and a passageway;

a plurality of test patterns passing through the multi-layer substrate structure, the heating temperature controlling unit, and the cooling temperature controlling unit, the plurality of test patterns configured to be electrically connected to the test circuit and pass test current therethrough; and a plurality of needles on a second surface of the multi-layer substrate structure, the plurality of needles electrically connected to the plurality of test patterns, wherein the first block including a plurality of first holes through which the plurality of test patterns pass, and the second block including a plurality of second holes through which the plurality of test patterns pass.

11. The probe card of claim 10, wherein the passageway is configured to flow fluid therethrough.

12. The probe card of claim 11, wherein the cooling fluid includes cooling gas or cooling liquid.

13. The probe card of claim 10, wherein the multi-layer substrate structure, the first block and the second block include a same material.

* * * * *